United States Patent
Toyoda et al.

(10) Patent No.: US 7,777,518 B2
(45) Date of Patent: Aug. 17, 2010

(54) SEMICONDUCTOR INTEGRATED CIRCUIT DEVICE

(75) Inventors: Yoshiaki Toyoda, Matsumoto (JP);
Kenichi Ishii, Matsumoto (JP); Morio Iwamizu, Matsumoto (JP)

(73) Assignee: Fuji Electric Systems Co., Ltd. (JP)

( * ) Notice: Subject to any disclaimer, the term of this patent is extended or adjusted under 35 U.S.C. 154(b) by 0 days.

(21) Appl. No.: 12/471,720

(22) Filed: May 26, 2009

(65) Prior Publication Data

US 2009/0289670 A1    Nov. 26, 2009

(30) Foreign Application Priority Data

May 26, 2008    (JP) .............................. 2008-136868

(51) Int. Cl.
*H03K 17/16*    (2006.01)
*H03K 19/003*    (2006.01)

(52) U.S. Cl. .............................. 326/33; 326/31; 326/82; 123/644; 123/652

(58) Field of Classification Search ........................ None
See application file for complete search history.

(56) References Cited

U.S. PATENT DOCUMENTS 6,283,104 B1 *    9/2001    Ito et al. ..................... 123/644

7,007,683 B2 *    3/2006    Naruse et al. ................ 123/618
7,205,822 B2        4/2007    Torres et al.
2003/0116149 A1 *    6/2003    Kohno et al. ................. 123/644

FOREIGN PATENT DOCUMENTS

JP        2982785 B2        9/1999
JP        4052815 B2        12/2007

* cited by examiner

*Primary Examiner*—Anh Q Tran
(74) *Attorney, Agent, or Firm*—Rossi, Kimms & McDowell LLP

(57) ABSTRACT

A buffer circuit is provided between a gate terminal of a pull-down transistor and a threshold circuit receiving a gate signal as an input signal. A voltage applied to an output terminal of a power semiconductor element from an external battery power supply is supplied to the buffer circuit through a resistive element. The buffer circuit converts the level of an on-signal output from the threshold circuit into a voltage higher than the threshold of the pull-down transistor, so that the pull-down transistor operates surely to turn off the power semiconductor element even when the level of the gate signal is low. Thus, there is provided a semiconductor integrated circuit device having a power semiconductor element which can be turned off by sure operation of a pull-down semiconductor element.

5 Claims, 6 Drawing Sheets

SEMICONDUCTOR INTEGRATED CIRCUIT DEVICE

BACKGROUND

The present invention relates to a semiconductor integrated circuit device and particularly relates to a semiconductor integrated circuit device having a power semiconductor element.

An igniter system using a power semiconductor element as an automobile igniter switching semiconductor element is one of purposes of a semiconductor integrated circuit device having a power semiconductor element. FIG. 6 is a circuit diagram showing the configuration of an igniter system according to the background art. As shown in FIG. 6, the igniter system according to the background art includes a one-chip semiconductor device 1, an igniter coil 2, and a battery power supply 3. The one-chip semiconductor device 1 has a power semiconductor element 4, a threshold circuit 5, a pull-down transistor 6, and a resistor 7. Three terminals, that is, an input terminal 8, an output terminal 9 and a ground terminal 10, are provided in the one-chip semiconductor device 1.

Collector and emitter terminals of the power semiconductor element 4 are connected to the output terminal 9 and the ground terminal 10 respectively. The output terminal 9 is connected to the battery power supply 3 through the igniter coil 2. The ground terminal 10 is grounded. A gate terminal of the power semiconductor element 4 is connected to the input terminal 8 through the resistor 7. A gate signal from the outside is input into the input terminal 8.

The threshold circuit 5 generates a reference voltage in its inside. The threshold circuit 5 compares the voltage of the gate signal with the reference voltage. The threshold circuit 5 outputs an on-signal when the voltage of the gate signal is lower than the reference voltage. The threshold circuit 5 outputs an off-signal when the voltage of the gate signal is not lower than the reference voltage. The voltage of the gate signal is supplied as a power supply voltage to the threshold circuit 5.

The pull-down transistor 6 is connected between the gate terminal of the power semiconductor element 4 and the ground terminal 10. The pull-down transistor 6 is turned on when the output signal of the threshold circuit 5 is an on-signal. As a result, the gate terminal of the power semiconductor element 4 is grounded and the gate voltage is provided as a ground voltage so that the power semiconductor element 4 is turned off. On the other hand, the pull-down transistor 6 is turned off when the output signal of the threshold circuit 5 is an off-signal. As a result, the gate signal is transmitted to the gate terminal of the power semiconductor element 4. When the voltage of the gate signal exceeds a threshold voltage of the power semiconductor element 4, the power semiconductor element 4 is turned on.

FIG. 7 is a timing chart showing the gate signal, the output signal of the threshold circuit, the gate voltage of the power semiconductor element and the output current of the power semiconductor element in the igniter system shown in FIG. 6. As shown in FIG. 7, the voltage (a) of the gate signal begins to increase at time T0, reaches the threshold voltage of the power semiconductor element at time T1, reaches the threshold voltage of the pull-down transistor at time T2 and reaches the reference voltage at time T3. Incidentally, assume T0<T1<T2<T3.

During a time period T0-T3, the voltage (b) of the output signal of the threshold circuit increases as the voltage (a) of the gate signal increases. On this occasion, the voltage (b) of the output signal of the threshold circuit is equalized to the voltage (a) of the gate signal because the threshold circuit uses the voltage (a) of the gate signal as a power supply voltage. In this time period, the pull-down transistor is on because the threshold circuit outputs an on-signal. Accordingly, the gate voltage of the power semiconductor element is provided as a ground voltage and the power semiconductor element is turned off, so that the output current is shut off. After the time T3, the threshold circuit outputs an off-signal so that the pull-down transistor is turned off. Accordingly, the voltage of the gate signal is applied to the gate terminal of the power semiconductor element to turn on the power semiconductor element, so that the output current flows.

On the other hand, the following in-vehicle igniter has been heretofore proposed. The in-vehicle igniter includes: an insulated gate semiconductor element which has a collector terminal, an emitter terminal, and a gate terminal; a current control circuit which limits the current flowing in the insulated gate semiconductor element by controlling the voltage of the gate terminal when the current exceeds a predetermined value; a voltage monitoring circuit which detects the electric potential of the collector; and a control current regulating circuit which controls the current flowing in the gate terminal in response to the output of the voltage monitoring circuit (e.g. see Japanese Patent No. 4052815).

Moreover, a configuration in which a control circuit for controlling a signal input to a gate terminal of a power semiconductor element is driven by a battery voltage has been heretofore known commonly (e.g. see U.S. Pat. No. 7,205,822). In addition, a depression type MOS (Metal Oxide Semiconductor) semiconductor element has been heretofore known commonly (e.g. see Japanese Patent No. 2982785.

In the background-art igniter system shown in FIG. 6, there is however the following problem. As shown in FIG. 7, in the time period T0-T2, the voltage (a) of the gate signal, that is, the voltage (b) of the output signal of the threshold circuit is lower than the threshold voltage of the pull-down transistor. Accordingly, in this time period, the pull-down transistor is turned off, so that the voltage of the gate signal is applied as a gate voltage (c) to the gate terminal of the power semiconductor element. After the gate voltage (c) of the power semiconductor element reaches the threshold of the power semiconductor element at time T1, the power semiconductor element is temporarily turned on until the pull-down transistor is turned on at time T2. For this reason, a minute current flows in the power semiconductor element during a time period T1-T2 though it is essentially necessary to shut off the output current (d) of the power semiconductor element during a time period T0-T3.

The area of the power semiconductor element is generally larger than the area of the pull-down transistor. For this reason, there is a possibility that a considerable sub-threshold current may flow if the gate voltage of the power semiconductor element cannot be sufficiently pulled down to the ground voltage even when the threshold voltage of the power semiconductor element is higher than the threshold voltage of the pull-down transistor.

In view of the above, it would be desirable to provide a semiconductor integrated circuit device which can operate a pull-down semiconductor element surely to turn off a power semiconductor element in order to solve the aforementioned problem in the background art.

SUMMARY OF THE INVENTION

A semiconductor integrated circuit device according to the invention includes a power semiconductor element, a pull-down semiconductor element, a threshold circuit, and a buffer circuit. The power semiconductor element has an output terminal supplied with a power supply voltage externally. The power semiconductor element applies an output current to the output terminal based on a gate signal input externally. The pull-down semiconductor element pulls down a gate voltage of the power semiconductor element to an off level of the power semiconductor element based on the gate signal. The threshold circuit outputs an on-signal or an off-signal for turning on or off the pull-down semiconductor element based on the gate signal. The buffer circuit converts the level of the on-signal output from the threshold circuit into a level for turning on the pull-down semiconductor element. The semiconductor integrated circuit device further includes a resistive element. The resistive element is connected to the output terminal of the power semiconductor element. The buffer circuit is driven by a voltage extracted from the output terminal of the power semiconductor element through the resistive element.

In this invention, the power semiconductor element may be a lateral power MOS transistor or a lateral IGBT (Insulated Gate Bipolar Transistor). The resistive element may be a diffused resistor formed in a surface region of a semiconductor substrate or a polysilicon resistor formed through an insulating film on the semiconductor substrate. Or the power semiconductor element may be a vertical IGBT or a vertical power MOS transistor. The resistive element may be a depression MOS semiconductor element.

According to this invention, the buffer circuit converts the level of the on-signal output from the threshold circuit into a level for turning on the pull-down semiconductor element. Accordingly, the pull-down semiconductor element can be turned on surely even when the voltage of the gate signal does not reach a level enough to turn on the pull-down semiconductor element.

The semiconductor integrated circuit device according to the invention has an effect that the pull-down semiconductor element can be operated surely to turn off the power semiconductor element.

BRIEF DESCRIPTION OF THE DRAWINGS

The invention will be described with reference to certain preferred embodiments thereof and the accompanying drawings, wherein.

DETAILED DESCRIPTION OF THE PREFERRED EMBODIMENTS

Preferred embodiments of the invention as to semiconductor integrated circuit devices will be described below in detail with reference to the accompanying drawings.

Figure 1:
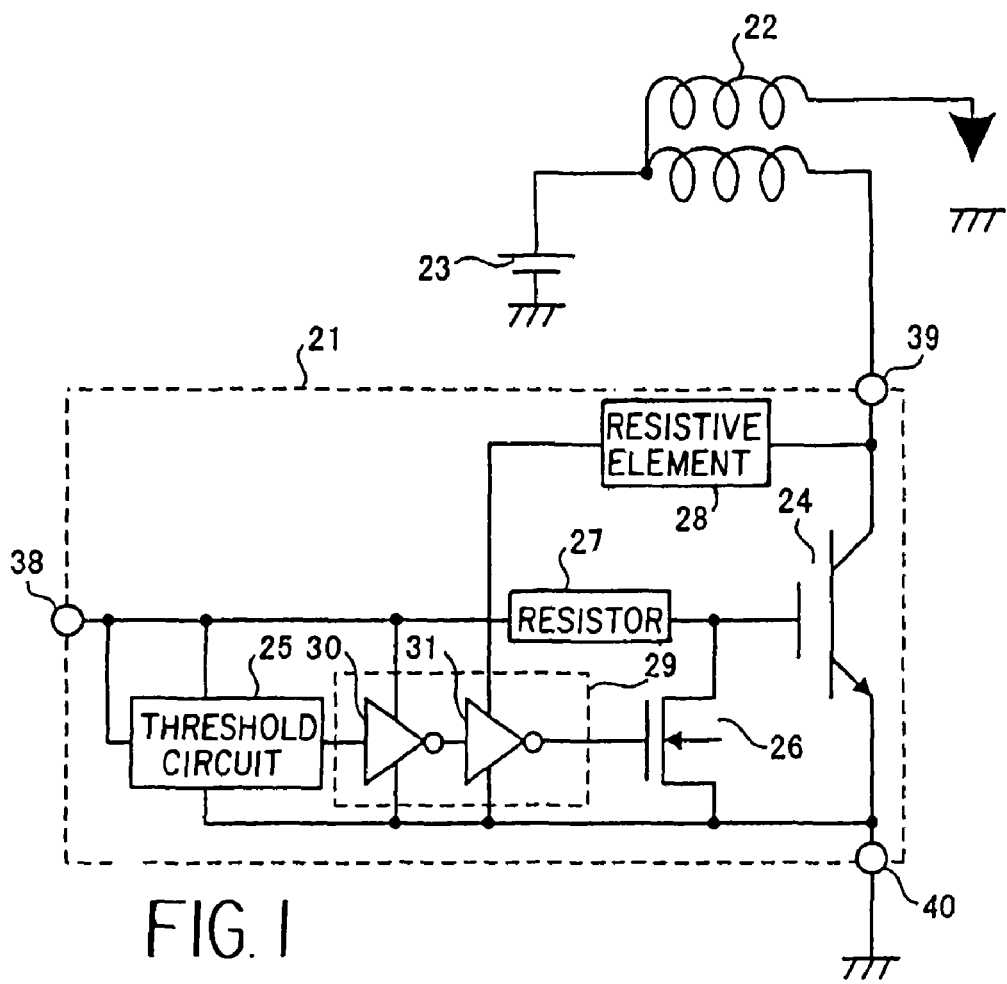
FIG. 1 is a circuit diagram showing the configuration of a semiconductor integrated circuit device according to an embodiment of the invention.

FIG. 1 is a circuit diagram showing the configuration of an igniter system using a semiconductor integrated circuit device according to an embodiment of the invention. As shown in FIG. 1, the semiconductor integrated circuit device is provided as a one-chip semiconductor device 21 in which a power semiconductor element 24, a threshold circuit 25, a pull-down transistor 26, a resistor 27, a resistive element 28 and a buffer circuit 29 are integrated. The buffer circuit 29 has a front-stage inverter 30, and a rear-stage inverter 31. Three terminals, that is, an input terminal 38, an output terminal 39 and a ground terminal 40, are provided in the one-chip semiconductor device 21.

In the igniter system using the one-chip semiconductor device 21, the output terminal 39 is connected to a battery power supply 23 through an igniter coil 22. The ground terminal 40 is grounded. A gate signal from the outside is input to the input terminal 38.

For example, the power semiconductor element 24 is an IGBT or a MOSFET (Metal Oxide Semiconductor Field Effect Transistor). In the following description, a collector terminal of the IGBT and a drain terminal of the MOSFET will be generically named 'collector terminal or the like' and an emitter terminal of the IGBT and a source terminal of the MOSFET will be generically named 'emitter terminal or the like'. The collector terminal or the like and the emitter terminal or the like of the power semiconductor element 24 are connected to the output terminal 39 and the ground terminal 40 respectively. The gate terminal of the power semiconductor element 24 is connected to the input terminal 38 through the resistor 27.

The threshold circuit 25 generates a reference voltage in its inside. The threshold circuit 25 compares the voltage of the gate signal with the reference voltage. The threshold circuit 25 outputs an on-signal when the voltage of the gate signal is lower than the reference voltage. The threshold circuit 25 outputs an off-signal when the voltage of the gate signal is not lower than the reference voltage. A ground voltage and the voltage of the gate signal as a power supply voltage are supplied to the threshold circuit 25. Accordingly, the level of the on-signal is equal to the level of the voltage of the gate signal whereas the level of the off-signal is equal to the level of the ground voltage.

The front-stage inverter 30 inverts the logic of the output signal of the threshold circuit 25. The ground voltage and the voltage of the gate signal as a power supply voltage are supplied to the front-stage inverter 30. Accordingly, the level of the output signal of the front-stage inverter 30 is equalized to the level of the ground voltage when the threshold circuit 25 outputs the on-signal. The level of the output signal of the front-stage inverter 30 is equalized to the level of the voltage of the gate signal when the threshold circuit 25 outputs the off-signal.

The rear-stage inverter 31 inverts the logic of the output signal of the front-stage inverter 30. The ground voltage and a voltage applied to the collector terminal or the like of the power semiconductor element 24 from the external battery power supply 23 (hereinafter referred to as 'collector voltage or the like') are supplied to the rear-stage inverter 31 through the resistive element 28. Accordingly, the level of the output signal of the rear-stage inverter 31 is equalized to the level of the collector voltage or the like when the output voltage of the front-stage inverter 30 is equal to the ground voltage. The level of the output signal of the rear-stage inverter 31 is equalized to the level of the ground voltage when the output voltage of the front-stage inverter 30 is equal to the voltage of the gate signal. Consequently, the buffer circuit 29 converts the voltage of the gate signal output as the on-signal from the threshold circuit 25 into the collector voltage or the like.

For example, the pull-down transistor 26 is an N-channel MOSFET. A gate terminal, a drain terminal and a source terminal of the pull-down transistor 26 are connected to the output terminal of the buffer circuit 29, the gate terminal of the power semiconductor element 24 and the ground terminal 40, respectively. The pull-down transistor 26 is turned on when the output signal of the threshold circuit 25 is an on-signal, that is, when the level of the output signal of the buffer circuit 29 is equal to the level of the collector voltage or the like. Consequently, the gate terminal of the power semiconductor element 24 is grounded, so that the gate voltage is equalized to the ground voltage. Accordingly, the power semiconductor element 24 is turned off, so that the output current is shut off.

On the other hand, the pull-down transistor 26 is turned off when the output signal of the threshold circuit 25 is an off-signal, that is, when the level of the output signal of the buffer circuit 29 is equal to the level of the ground voltage. Consequently, the gate signal is transmitted to the gate terminal of the power semiconductor element 24. When the voltage of the gate signal exceeds the threshold of the power semiconductor element 24, the power semiconductor element 24 is turned on so that the output current flows.

Figure 2:
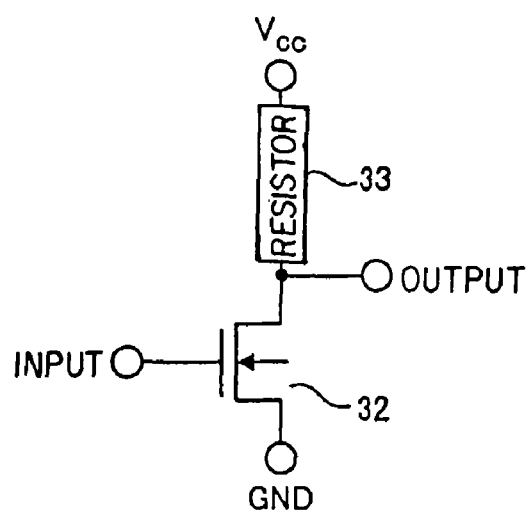
FIG. 2 is a circuit diagram showing an example of configuration of each inverter in a buffer circuit.

FIG. 2 is a circuit diagram showing an example of configuration of each inverter in the buffer circuit. For example, as shown in FIG. 2, the inverter has an N-channel MOSFET 32, and a pull-up resistor 33. The resistor 33 is connected to a drain terminal of the MOSFET 32. A source terminal of the MOSFET 32 is grounded. An output signal of a previous-stage circuit not shown is input to a gate terminal of the MOSFET 32. The drain terminal of the MOSFET 32 is connected to a next-stage circuit not shown.

When the level of the output signal of the previous-stage circuit is lower than the threshold of the MOSFET 32, the MOSFET 32 is turned off. Consequently, the level of the drain output of the MOSFET 32 is pulled up to a power supply voltage Vcc through the resistor 33. When the level of the output signal of the previous-stage circuit reaches the threshold of the MOSFET 32, the MOSFET 32 is turned on. Consequently, the level of the drain output of the MOSFET 32 is equalized to the ground voltage GND. On this occasion, the threshold of the MOSFET 32 is equivalent to the threshold of the pull-down transistor.

When this inverter is the front-stage inverter, the output signal of the threshold circuit is input to the gate terminal of the MOSFET 32. The drain terminal of the MOSFET 32 is connected to the rear-stage inverter. On this occasion, the power supply voltage Vcc is equal to the voltage of the gate signal. On the other hand, when this inverter is the rear-stage inverter, the output signal of the front-stage inverter is input to the gate terminal of the MOSFET 32. The drain terminal of the MOSFET 32 is connected as an output terminal of the buffer circuit to the gate terminal of the pull-down transistor. On this occasion, the power supply voltage Vcc is equal to the collector voltage or the like.

Figure 3:
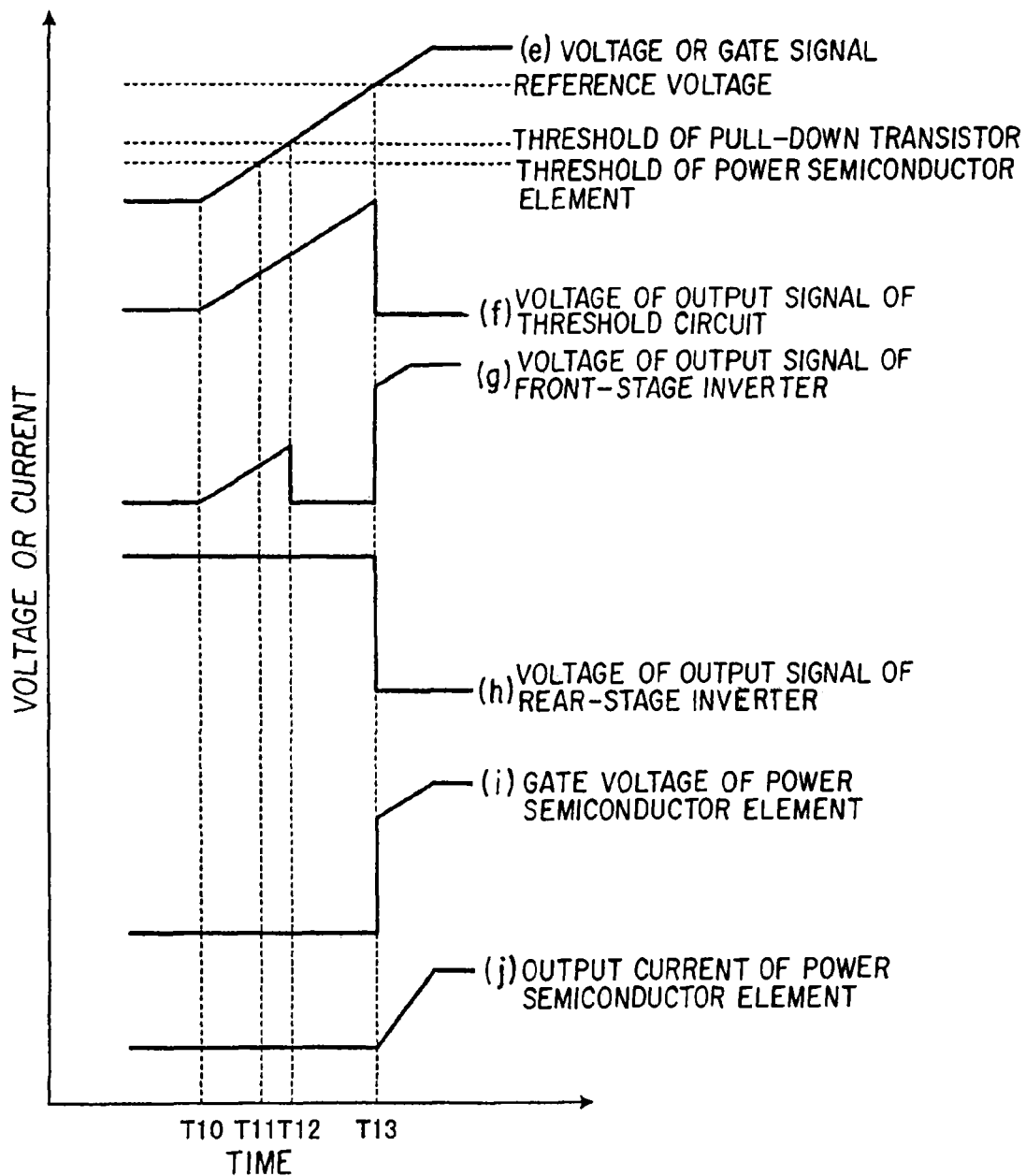
FIG. 3 is a timing chart showing operating timing of the semiconductor integrated circuit device depicted in FIG. 1.

FIG. 3 is a timing chart showing the gate signal, the output signal of the threshold circuit, the output signal of the front-stage inverter, the output signal of the rear-stage inverter, the gate voltage of the power semiconductor element and the output current of the power semiconductor element in the one-chip semiconductor device shown in FIG. 1. As shown in FIG. 3, the voltage (e) of the gate signal begins to increase at time T10, reaches the threshold of the power semiconductor element at time T11, reaches the threshold of the pull-down transistor at time T12 and reaches the reference voltage at time T13. Incidentally, assume T10<T11<T12<T13.

During a time period T10-T12, the voltage (f) of the output signal of the threshold circuit and the voltage (g) of the output signal of the front-stage inverter increase as the voltage (e) of the gate signal increases. On this occasion, the voltage (f) of the output signal of the threshold circuit and the voltage (g) of the output signal of the front-stage inverter are equalized to the voltage (e) of the gate signal because the threshold circuit and the front-stage inverter use the voltage (e) of the gate signal as a power supply voltage. In this time period, the voltage (e) of the gate signal is lower than the threshold of the pull-down transistor.

Because the threshold of the MOSFET of the rear-stage inverter is equal to the threshold of the pull-down transistor as described above, the voltage (g) of the output signal of the front-stage inverter becomes lower than the threshold of the MOSFET of the rear-stage inverter. That is, the MOSFET of the rear-stage inverter is turned off, so that the voltage (h) of the output signal of the rear-stage inverter is equalized to the collector voltage or the like. Consequently, the pull-down transistor is turned on, so that the gate voltage (i) of the power semiconductor element is equalized to the ground voltage. Accordingly, the power semiconductor element is turned off, so that the output current is shut off.

During a time period T12-T13, the voltage (e) of the gate signal is higher than the threshold of the pull-down transistor. Because the threshold of the MOSFET of the front-stage inverter is equal to the threshold of the pull-down transistor as described above, the MOSFET of the front-stage inverter is turned on so that the voltage (g) of the output signal of the front-stage inverter is equalized to the ground voltage. Accordingly, because the MOSFET of the rear-stage inverter is still off, the state of the pull-down transistor and the state of the power semiconductor element are the same as in the time period T10-T12, so that the output current (j) of the power semiconductor element is shut off.

After the time T13, the threshold circuit outputs an off-signal so that the voltage (g) of the output signal of the front-stage inverter increases similarly to the voltage of the gate signal. On this occasion, the voltage (h) of the output signal of the rear-stage inverter is equalized to the ground voltage because the voltage of the output signal of the front-stage inverter is higher than the threshold of the MOSFET of the rear-stage inverter. Accordingly, the pull-down transistor is turned off, so that the voltage of the gate signal is applied to the gate terminal of the power semiconductor element. Consequently, the power semiconductor element is turned on, so that the output current (j) of the power semiconductor element flows.

The device structure of the one-chip semiconductor device 21 shown in FIG. 1 will be described below. In the following description and the accompanying drawings, the prefix 'N' or 'P' attached to a layer or region means that electrons or holes are majority carriers. The superscript '+' attached to the prefix 'N' or 'P' means that the impurity concentration of the layer or region is higher than that of a layer or region having no superscript '+'. Incidentally, like numerals refer to like constituent parts for the sake of avoidance of duplicate description.

Figure 4:
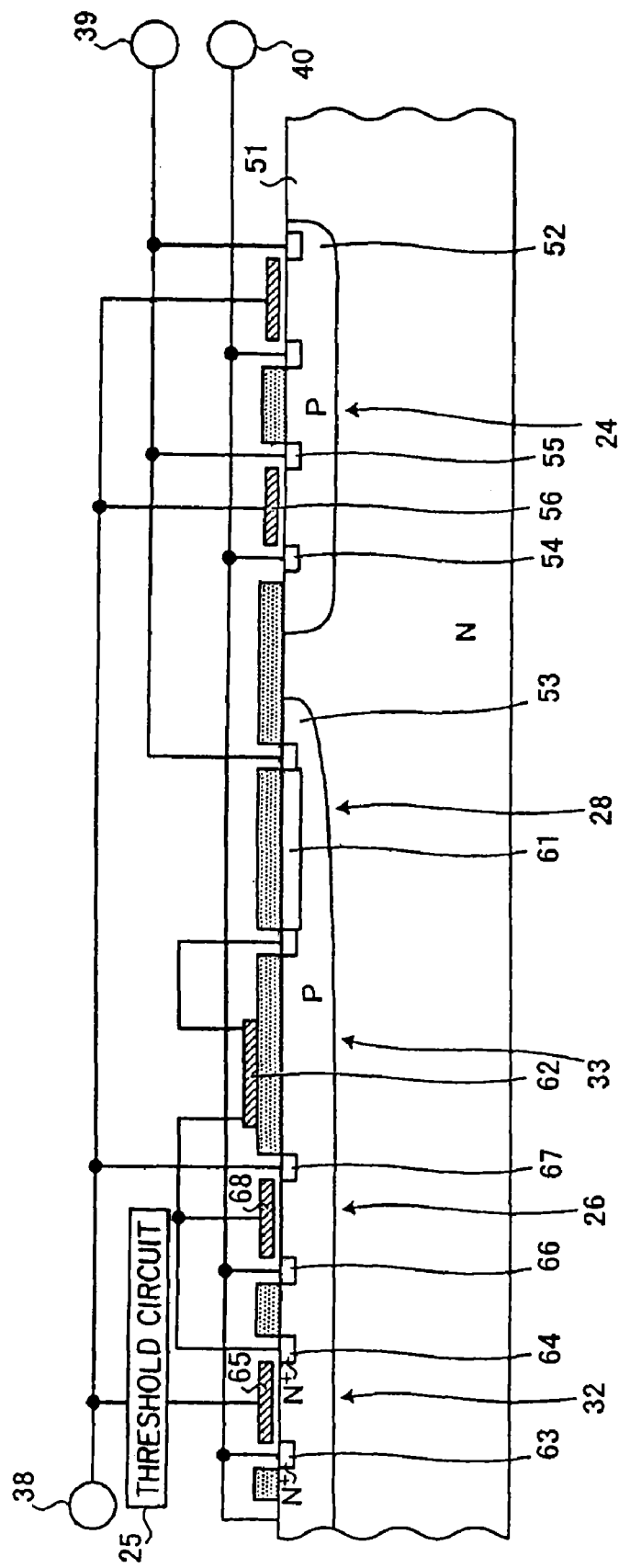
FIG. 4 is a sectional view showing an example of device structure of the semiconductor integrated circuit device according to the embodiment.

FIG. 4 is a sectional view showing the device structure of the one-chip semiconductor device using a lateral power element. As shown in FIG. 4, a first P-type semiconductor region 52 and a second P-type semiconductor region 53 are provided in a surface region of an N-type semiconductor substrate 51.

An $N^+$-type source region 54 and an $N^+$-type drain region 55 are provided in a surface region of the first P-type semiconductor region 52. A gate electrode 56 is provided, through a gate insulating film not shown, on a front surface of the first P-type semiconductor region 52 between the $N^+$-type source region 54 and the $N^+$-type drain region 55. The first P-type semiconductor region 52, the $N^+$-type source region 54, the $N^+$-type drain region 55, the gate insulating film and the gate electrode 56 form a lateral power MOSFET. The lateral power MOSFET forms the power semiconductor element 24. The gate electrode 56 is electrically connected to the input terminal 38. The $N^+$-type drain region 55 is electrically connected to the output terminal 39. The $N^+$-type source region 54 is electrically connected to the ground terminal 40. Incidentally, a $P^+$-type collector region may be further formed in the $N^+$-type drain region 55 so as to be connected, in place of the $N^+$-type drain region 55, to the output terminal 39 to thereby form a lateral IGBT.

A diffusion region 61 forming the resistive element 28 is provided in a surface region of the second P-type semiconductor region 53. Incidentally, the resistive element 28 may be replaced by a polysilicon resistor which is formed on an insulating film on the front surface of the second P-type semiconductor region 53 in place of the diffusion region 61. For example, a polysilicon film 62 forming the resistor 33 of the rear-stage inverter is provided on the insulating film on the front surface of the second P-type semiconductor region 53.

An $N^+$-type source region 63 and an $N^+$-type drain region 64 are provided in a surface region of the second P-type semiconductor region 53. A gate electrode 65 is provided, through a gate insulating film not shown, on the front surface of the second P-type semiconductor region 53 between the $N^+$-type source region 63 and the $N^+$-type drain region 64. The second P-type semiconductor region 53, the $N^+$-type source region 63, the $N^+$-type drain region 64, the gate insulating film and the gate electrode 65 form a lateral MOSFET. The lateral MOSFET forms the MOSFET 32 of the rear-stage inverter.

An $N^+$-type source region 66 and an $N^+$-type drain region 67 are further provided in the surface region of the second P-type semiconductor region 53. A gate electrode 68 is provided, through a gate insulating film not shown, on the front surface of the second P-type semiconductor region 53 between the $N^+$-type source region 66 and the $N^+$-type drain region 67. The second P-type semiconductor region 53, the $N^+$-type source region 66, the $N^+$-type drain region 67, the gate insulating film and the gate electrode 68 form a lateral MOSFET. The lateral MOSFET forms the pull-down resistor 26.

One end of the diffusion region 61 is electrically connected to the output terminal 39. The other end of the diffusion region 61 is electrically connected to one end of the polysilicon film 62. The other end of the polysilicon film 62 is electrically connected to the $N^+$-type drain region 64 of the MOSFET 32 of the rear-stage inverter and the gate electrode 68 of the pull-down transistor 26. The $N^+$-type source region 63 of the MOSFET 32 of the rear-stage inverter is electrically connected to the ground terminal 40. The gate electrode 65 of the MOSFET 32 of the rear-stage inverter is connected to the front-stage inverter not shown. The front-stage inverter is connected to the threshold circuit 25. The front-stage inverter and the threshold circuit 25 are provided on the N-type semiconductor substrate 51.

The $N^+$-type source region 66 of the pull-down transistor 26 is electrically connected to the ground terminal 40. The $N^+$-type drain region 67 of the pull-down transistor 26 is electrically connected to the input terminal 38. In the configuration shown in FIG. 4, the voltage applied to the output terminal 39 is supplied to the MOSFET 32 of the rear-stage inverter through a diffusion resistive element.

Figure 5:
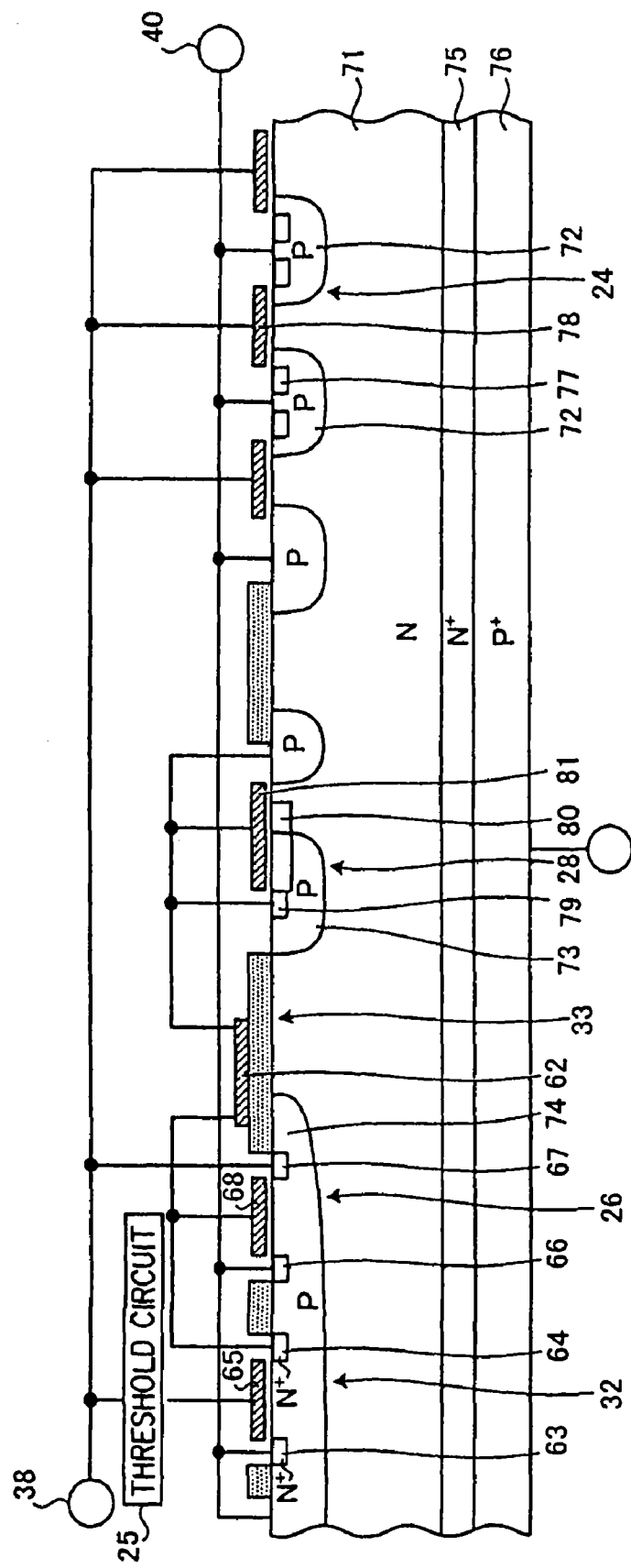
FIG. 5 is a sectional view showing another example of device structure of the semiconductor integrated circuit device according to the embodiment.
Figure 6:
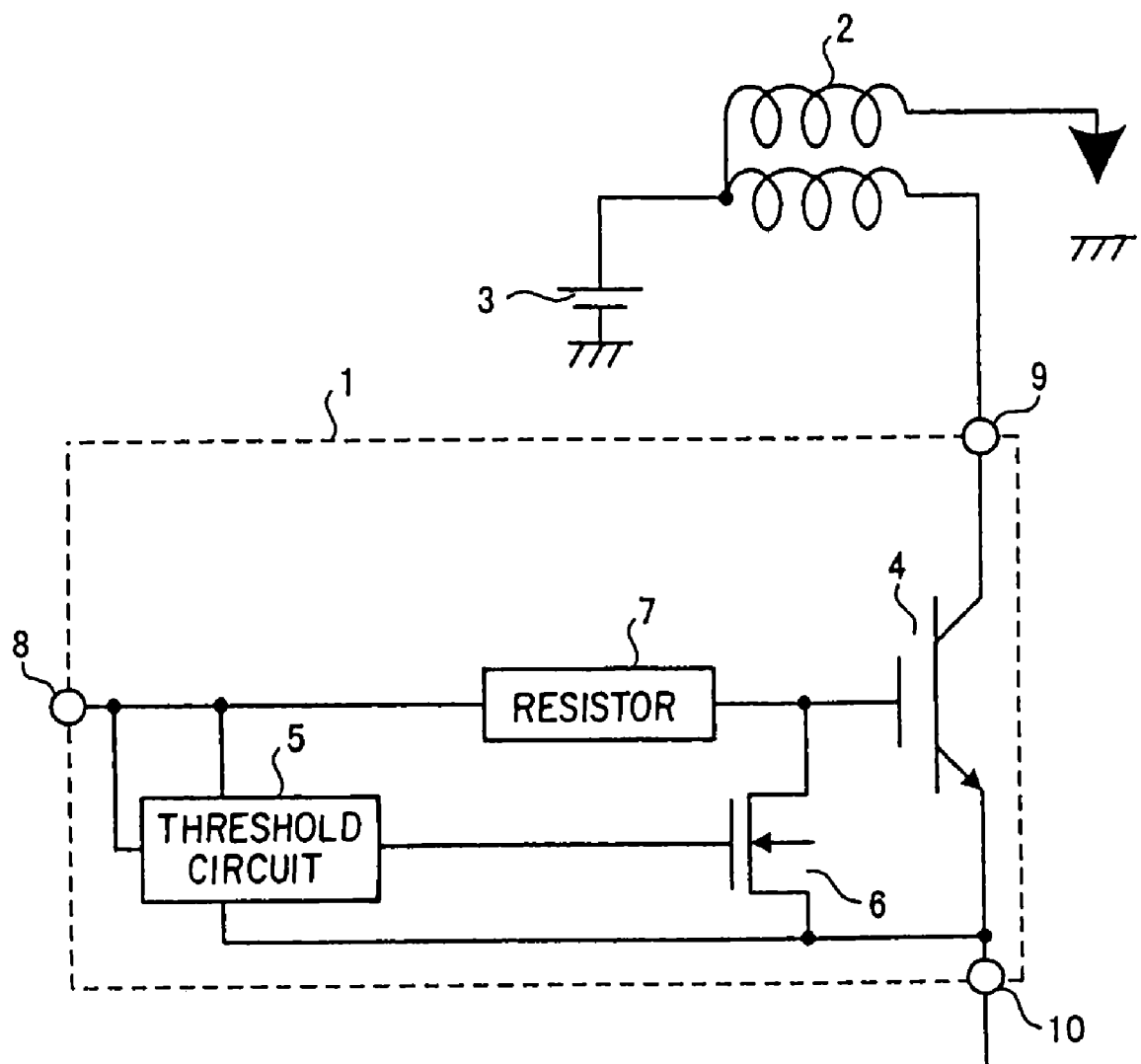
FIG. 6 is a circuit diagram showing the configuration of an igniter system according to the background art.
Figure 7:
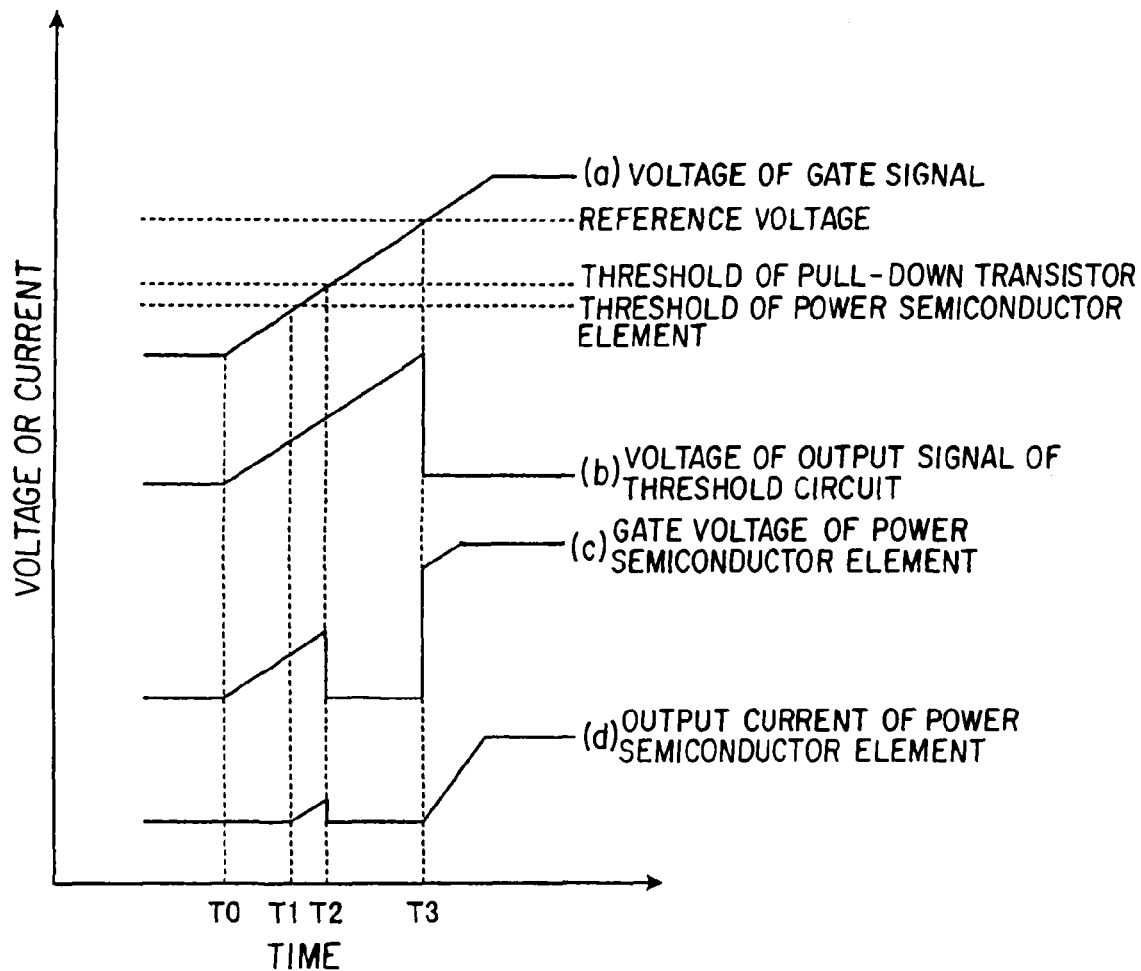
FIG. 7 is a timing chart showing operating timing of the igniter system depicted in FIG. 6.

FIG. 5 is a sectional view showing the device structure of the one-chip semiconductor device using a vertical power element. As shown in FIG. 5, a first P-type semiconductor region 72, a second P-type semiconductor region 73 and a third P-type semiconductor region 74 are provided in a front surface region of an N-type semiconductor substrate 71. An $N^+$-type buffer layer 75 is provided in a rear surface region of the N-type semiconductor substrate 71. A $P^+$-type collector layer 76 is provided on a surface of the $N^+$-type buffer layer 75. The $P^+$-type collector layer 76 is electrically connected to the output terminal 39.

An $N^+$-type emitter region 77 is provided in a surface region of the first P-type semiconductor region 72. A gate electrode 78 is provided, through a gate insulating film not shown, on a surface of the first P-type semiconductor region 72 between the $N^+$-type emitter region 77 and the N-type semiconductor substrate 71. The first P-type semiconductor region 72, the $N^+$-type emitter region 77, the gate insulating film, the gate electrode 78, the N-type semiconductor substrate 71, the $N^+$-type buffer layer 75 and the $P^+$-type collector layer 76 form a vertical IGBT. The vertical IGBT forms the power semiconductor element 24. The gate electrode 78 is electrically connected to the input terminal 38. The $N^+$-type emitter region 77 and the first P-type semiconductor region 72 are electrically connected to the ground terminal 40. Incidentally, the $N^+$-type buffer layer 75 may be connected to the output terminal 39 without formation of the $P^+$-type collector layer 76 to form a vertical power MOS transistor.

An $N^+$-type emitter region 79 and a channel region 80 are provided in a surface region of the second P-type semiconductor region 73. A gate electrode 81 is provided, through a gate insulating film not shown, on a surface of the channel region 80. The second P-type semiconductor region 73, the $N^+$-type emitter region 79, the channel region 80, the gate insulating film, a gate electrode 81, the N-type semiconductor substrate 71, the $N^+$-type buffer layer 75 and the $P^+$-type collector layer 76 form a depression type vertical MOS semiconductor element. The depression type vertical MOS semiconductor element forms the resistive element 28. For example, the $N^+$-type emitter region 79 and the gate electrode 81 are electrically connected to one end of a polysilicon film 62 forming the resistor 33 of the rear-stage inverter. The polysilicon film 62 is provided on an insulating film on the front surface of the N-type semiconductor substrate 71.

The MOSFET 32 of the rear-stage inverter and the pull-down transistor 26 are provided in the third P-type semiconductor region 74. The configuration of each of the MOSFET 32 of the rear-stage inverter and the pull-down transistor 26 is the same as the aforementioned 'device structure using lateral power element'. The front-stage inverter and the threshold circuit 25 are the same as described above. In the configuration shown in FIG. 5, the voltage applied to the output terminal 39 is supplied to the MOSFET 32 of the rear-stage inverter through the depression type vertical MOS semiconductor element.

As described above, in accordance with the embodiment, the buffer circuit 29 converts the level of the on-signal output from the threshold circuit 25 into a voltage higher than the threshold of the pull-down transistor 26. Accordingly, even when the voltage of the gate signal is lower than the threshold of the pull-down transistor 26, the pull-down transistor 26 can be operated surely to turn off the power semiconductor element 24. Accordingly, when the level of the gate signal is low, a minute current flowing in the power semiconductor element 24 can be shut off surely. Moreover, when a power supply voltage is supplied to the buffer circuit 29 from the collector terminal or the like of the power semiconductor element 24, the aforementioned minute current shutting-off function can be achieved without provision of any new battery power supply terminal in the one-chip semiconductor device 21.

In the above description, the invention is not limited to the aforementioned embodiments but can be changed variously. For example, configuration may be made so that the logic of the threshold circuit is inverted so that the buffer circuit can dispense with the front-stage inverter. In addition, the invention is effective even when the conductivity type of each of the semiconductor layers and semiconductor regions is inverted.

As described above, the semiconductor integrated circuit device according to the invention is useful for a semiconductor integrated circuit device in which a power semiconductor element and a circuit for controlling the power semiconductor element are integrated into one chip. Particularly, the semiconductor integrated circuit device according to the invention is suitable for a switching semiconductor element for an automobile igniter.

The invention has been described with reference to certain preferred embodiments thereof. It will be understood that modifications and variations are possible within the scope of the appended claims.

This application is based on, and claims priority to, Japanese Patent Application No: 2008-136868, filed on May 26, 2008. The disclosure of the priority application, in its entirety, including the drawings, claims, and the specification thereof, is incorporated herein by reference.

What is claimed is:

1. A semiconductor integrated circuit device comprising:
    a power semiconductor element including an output terminal supplied with a power supply voltage externally and which applies an output current to the output terminal based on a gate signal input externally;
    a pull-down semiconductor element which pulls down a gate voltage of the power semiconductor element to an off level of the power semiconductor element based on the gate signal;
    a threshold circuit which outputs an on-signal or an off-signal for turning on or off the pull-down semiconductor element based on the gate signal;
    a buffer circuit which converts the level of the on-signal output from the threshold circuit into a level for turning on the pull-down semiconductor element; and
    a resistive element which is connected to the output terminal of the power semiconductor element;
    wherein the buffer circuit is driven by a voltage extracted from the output terminal through the resistive element.

2. A semiconductor integrated circuit device according to claim 1, wherein the power semiconductor element is a lateral power MOS transistor or a lateral IGBT.

3. A semiconductor integrated circuit device according to claim 2, wherein the resistive element is a diffused resistor formed in a surface region of a semiconductor substrate or a polysilicon resistor formed through an insulating film on the semiconductor substrate.

4. A semiconductor integrated circuit device according to claim 1, wherein the power semiconductor element is a vertical IGBT or a vertical power MOS transistor.

5. A semiconductor integrated circuit device according to claim 4, wherein the resistive element is a depression MOS semiconductor element.

* * * * *